United States Patent [19]
Yoeli et al.

[11] Patent Number: 5,751,165
[45] Date of Patent: May 12, 1998

[54] HIGH SPEED CUSTOMIZABLE LOGIC ARRAY DEVICE

[75] Inventors: Uzi Yoeli; Eran Rotem; Meir Janai; Zvi Orbach, all of Haifa, Israel

[73] Assignee: Chip Express (Israel) Ltd., Haifa, Israel

[21] Appl. No.: 516,739

[22] Filed: Aug. 18, 1995

[51] Int. Cl.$^6$ .................................................. H03K 19/177
[52] U.S. Cl. .................................. 326/47; 326/39; 326/45
[58] Field of Search .................................. 326/39, 41, 45, 326/47; 257/758

[56] References Cited

U.S. PATENT DOCUMENTS

| | | | |
|---|---|---|---|
| 4,558,236 | 12/1985 | Burrows . | |
| 4,682,055 | 7/1987 | Upadhyayula | 326/31 |
| 4,706,216 | 11/1987 | Carter | 326/39 |
| 5,089,973 | 2/1992 | Furtek | 326/39 |
| 5,109,168 | 4/1992 | Rusu | 307/480 |
| 5,119,158 | 6/1992 | Hatano | 257/203 |
| 5,122,685 | 6/1992 | Chan et al. | 326/40 |
| 5,165,046 | 11/1992 | Hesson | 326/58 |
| 5,341,041 | 8/1994 | El Gamal | 326/39 |
| 5,451,887 | 9/1995 | El-Ayat et al. | 326/41 |
| 5,468,997 | 11/1995 | Imai | 257/758 |
| 5,475,264 | 12/1995 | Sudo | 257/758 |
| 5,479,054 | 12/1995 | Tottori | 257/758 |

FOREIGN PATENT DOCUMENTS 0394598 10/1990 European Pat. Off. .

OTHER PUBLICATIONS

D. Takashima et al., "Standby/Active Mode Logic for Sub–1–V Operating ULSI Memory", IEICE Transactions on Electronics, vol. E77–C, No. 5, pp. 771–776, May 1, 1994.

C.M. Maxfield, "Delay Effects Rule In Deep–Submicron ICs", Electronic Design, vol. 43, No. 12, pp. 109–110, 112, 114, 116, 118, 120, 122, Jun. 12, 1995.

Landers, R.J., A multiplexer–based architecture for high–density, low–power gate arrays, *IEEE Journal of Solid–State Circuits*, vol. 30, No. 4, 1995, pp. 392–396.

Maxfield, C., Delay effects rule in deep–submicron ICs, *Electronic Design*, Jun. 1995, pp. 109–122.

Chen, John Y.; "CMOS Devices and Technology for VLSI"; copyright 1990 by Prentice–Hall, Inc.; pp. 94–98.

Streetman, Ben IG.; "Solid State Electronic Devices"; copyright 1980 by Prentice–Hall, Inc.; p. 443.

*Primary Examiner*—Edward P. Westin
*Assistant Examiner*—Benjamin D. Driscoll
*Attorney, Agent, or Firm*—Browdy and Neimark

[57] ABSTRACT

A very high speed customizable logic array device comprising:

a substrate having at least one gate layer and at least first, second and third metal layers formed thereon, the gate layer including a multiplicity of identical unit logic cells, the customizable logic array device including at least three of the following functionalities:

NAND, NOR, inverter, AND and OR and further being characterized in that the ratio between the rise time and the fall time of the logic cells embodying each of the at least three functionalities is constant.

15 Claims, 8 Drawing Sheets

NAND2

NOR2

TIME

NAND2

NOR2

TIME

TIME

TIME

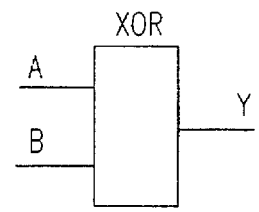
FIG. 5A
PRIOR ART
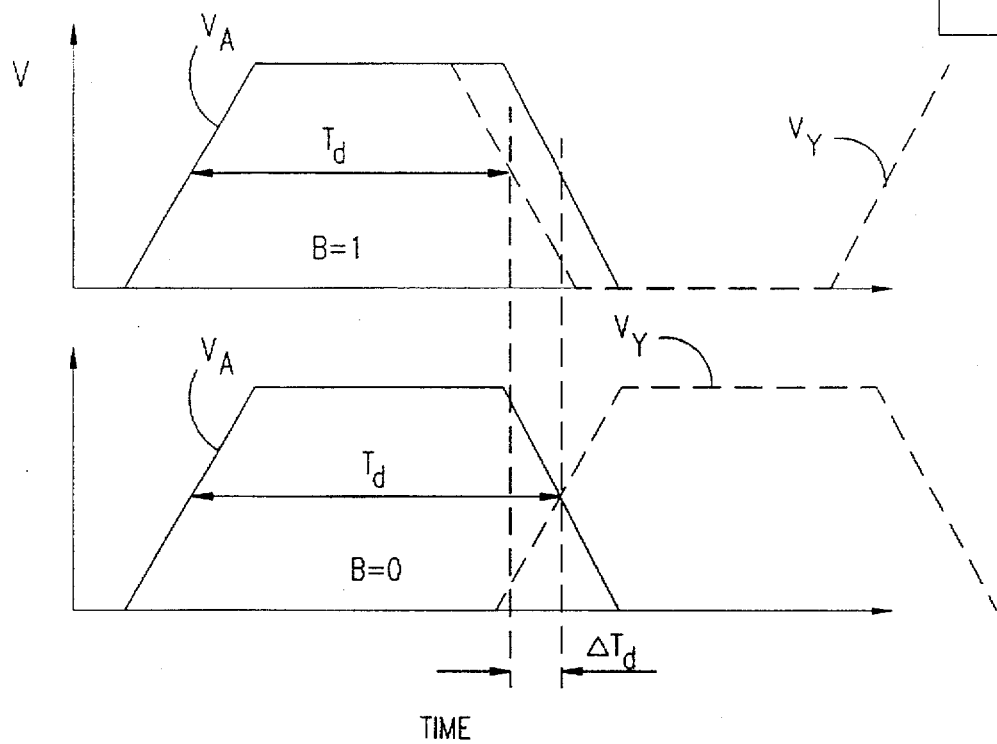
FIG. 5B
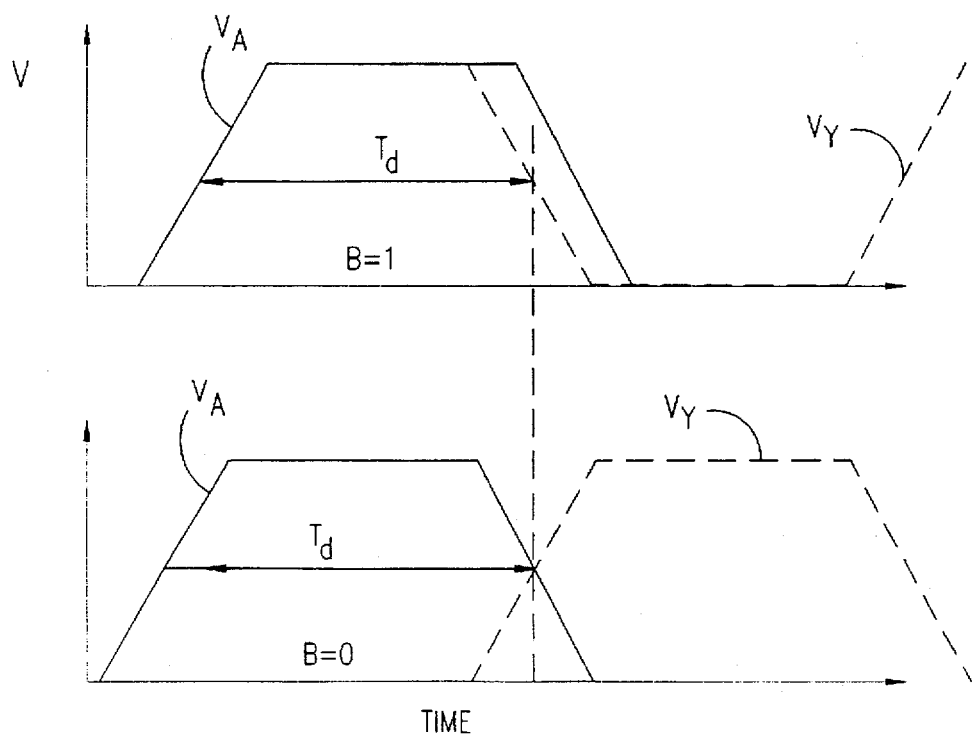

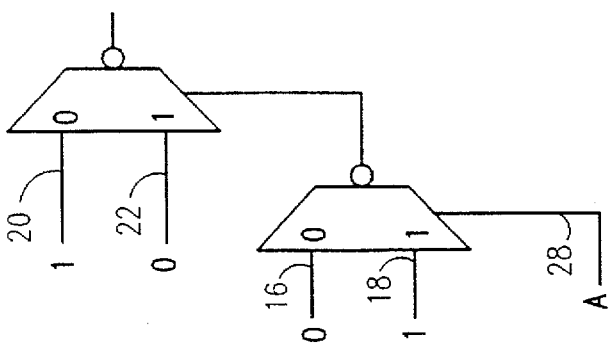
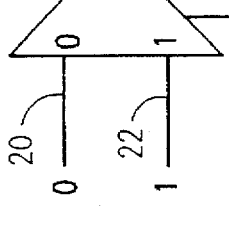
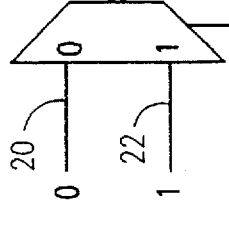
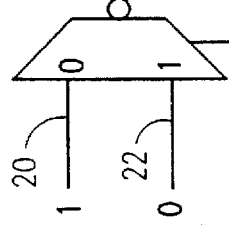
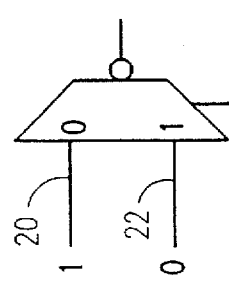

HIGH SPEED CUSTOMIZABLE LOGIC ARRAY DEVICE

FIELD OF THE INVENTION

The present invention relates to application-specific integrated circuits generally and more particularly to the structure of principal building blocks of gate arrays.

BACKGROUND OF THE INVENTION

Microelectronic integrated circuits can be divided roughly into two categories: off-the-shelf devices and custom devices. Custom devices may be divided into three categories: full-custom, standard cell and gate arrays. Gate arrays are simpler to design and manufacture than the other two categories. They usually include only one type of building block. Only the metal interconnect layers have to be customized for each application. The basic building block, also referred to below as a unit logic cell, is commonly of the NAND type.

Recently relatively complex unit logic cells have been proposed for use in gate arrays. Such unit logic cells are described, for example, in R. J. Landers, S. S. Mahant-Shetti and C. Lemonds, A Multiplexer-Based Architecture for High Density, Low Power Gate Arrays, IEEE Journal of Solid-State Circuits, Vol. 30, No. 4, April 1995, pp 392–396.

The relatively complex unit logic cells have the advantage that they enable reduction of the area necessary to implement a given design and the resulting power dissipation.

Gate arrays which employ conventional unit logic cells, and particularly those which employ the common 2-input NAND cells, suffer from various disadvantages, summarized hereinbelow, which are becoming increasingly significant as device geometries shrink to the deep sub-micron regime and device gate-counts rise to the millions. Reference is made in this connection to "Delay Effects Rule in Deep Submicron ICs" C. Maxfield, in Electronic Design, Jun. 12, 1995, pp. 109–122.

When different logic functions, such as a NAND gate and a NOR gate, are implemented in unit logic cells of a gate array which has one fixed size of transistors, while they drive the same load, the slopes of the rise and fall times of their output signals behave very differently, as seen in FIG. 1A. This phenomenon complicates the calculation and adjustment of delays of signals which arrive from different logic cells.

When different logic functions are implemented on prior-art unit logic cells, their input switching voltage thresholds are functionally dependent. For example, in a given cell library, different logic cells may switch between 0.28 and 0.5 times the Vcc voltage, as seen in FIG. 2A. Together with the above-described phenomenon of the functionality-dependent slope of the output signals, the functional dependency of the input switching voltage thresholds makes the calculation of switching time and signal delay highly complicated.

A further second-order complication of prior art gate arrays is that their switching point is a function of the slope of the incoming signal. Hence if the response to a slow switching signal occurs at 0.3 Vcc, the response to a fast switching signal may occur at 0.4 Vcc. This is known as "slope-dependent delay".

In prior art gate arrays, the gate driving capability, and hence the slope of the output signal, is usually a function of the logic state (0 or 1) of the other inputs to that gate. This is known as "state dependent drive capability" and is illustrated in FIG. 3A.

In prior art gate arrays, the gate driving capability and hence the slope of the output signal usually depend on which input caused the output to occur. This is known as "path-dependent drive capability" and is illustrated in FIG. 4A.

Also in prior art gate arrays, the delay between a transition occurring at the input to a gate and a corresponding transition occurring at the output from that gate is usually a function of the logic state (0 or 1) of the other inputs to that gate. This is known as "state dependent pin-to-pin delay" and is illustrated in FIG. 5A.

As a result of the above-described phenomena the total delay from the input to a gate, through that gate and onwards to a load gate can vary by 100% or more from transition to transition in deep sub-micron technology. This makes the timing calculation and verification of digital ASICs a complex task.

One way to overcome the above difficulties is to produce computer-aided design and simulation tools having increasingly sophisticated algorithms combined with models which can handle the highly complex design task.

SUMMARY OF THE INVENTION

The present invention seeks to provide a gate array having a unit logic cell design which generally eliminates the above-described phenomena.

There is thus provided in accordance with a preferred embodiment of the present invention a very high speed customizable logic array device comprising:

a substrate having at least one gate layer and at least first, second and third metal layers formed thereon, the gate layer including a multiplicity of identical unit logic cells, the customizable logic array device including at least three of the following functionalities:

NAND, NOR, inverter, AND and OR and further being characterized in that the ratio between the rise time and the fall time of the logic cells embodying each of the at least three functionalities is constant.

Preferably, the ratio between the rise time and the fall time is about 1.

There is also provided in accordance with a preferred embodiment of the present invention a very high speed customizable logic array device comprising:

a substrate having at least one gate layer and at least first, second and third metal layers formed thereon, the gate layer including a multiplicity of identical unit logic cells, the customizable logic array device including at least three of the following functionalities:

NAND, NOR, inverter, AND and OR and further being characterized in that the at least three functionalities, when driving identical circuitry, all have identical rise times and identical fall times.

There is additionally provided in accordance with a preferred embodiment of the present invention a very high speed customizable logic array device comprising:

a substrate having at least one gate layer and at least first, second and third metal layers formed thereon, the gate layer including a multiplicity of identical unit logic cells, the customizable logic array device including at least three of the following functionalities:

NAND, NOR, inverter, AND and OR and further being characterized in that the at least three functionalities all operate on at least one of generally similar switching voltage and generally similar timing.

There is further provided in accordance with a preferred embodiment of the present invention a very high speed customizable logic array device comprising:

a substrate having at least one gate layer and at least first, second and third metal layers formed thereon, the gate layer including a multiplicity of identical unit logic cells, the customizable logic array device including at least three of the following functionalities:

NAND, NOR, inverter, AND and OR and further being characterized in that the at least three functionalities all operate on a generally similar switching voltage.

Preferably the at least three functionalities all operate on a generally similar switching voltage.

In accordance with a preferred embodiment of the present invention the timing is state independent.

Preferably, the switching voltages of the at least three functionalities differ from each other by less than 10%.

In accordance with a preferred embodiment of the present invention the multiplicity of unit logic cells each comprise at least one multiplexer.

Preferably, the functionalities are implemented by configuring at least one of the second and third metal layers.

In accordance with a preferred embodiment of the present invention the rise time and fall time for at least one of the logic cells are each less than 1 nanosecond for 0.6 micron CMOS technology, when this cell drives the load of one similar cell.

BRIEF DESCRIPTION OF THE DRAWINGS

The present invention will be understood and appreciated more fully from the following detailed description, taken in conjunction with the drawings in which:

FIG. 5A illustrates the state dependency of the pin-to-pin delay time of a given function in prior art gate arrays;

FIG. 5B illustrates the state independence of the pin-to-pin delay time of a given function in gate arrays constructed and operative in accordance with a preferred embodiment of the present invention;

FIGS. 8A, 8B, 8C, 8D and 8E illustrate five different logic functionalities implementable in the unit logic cell of FIGS. 6 and 7.

DETAILED DESCRIPTION OF A PREFERRED EMBODIMENT

Figure 6:
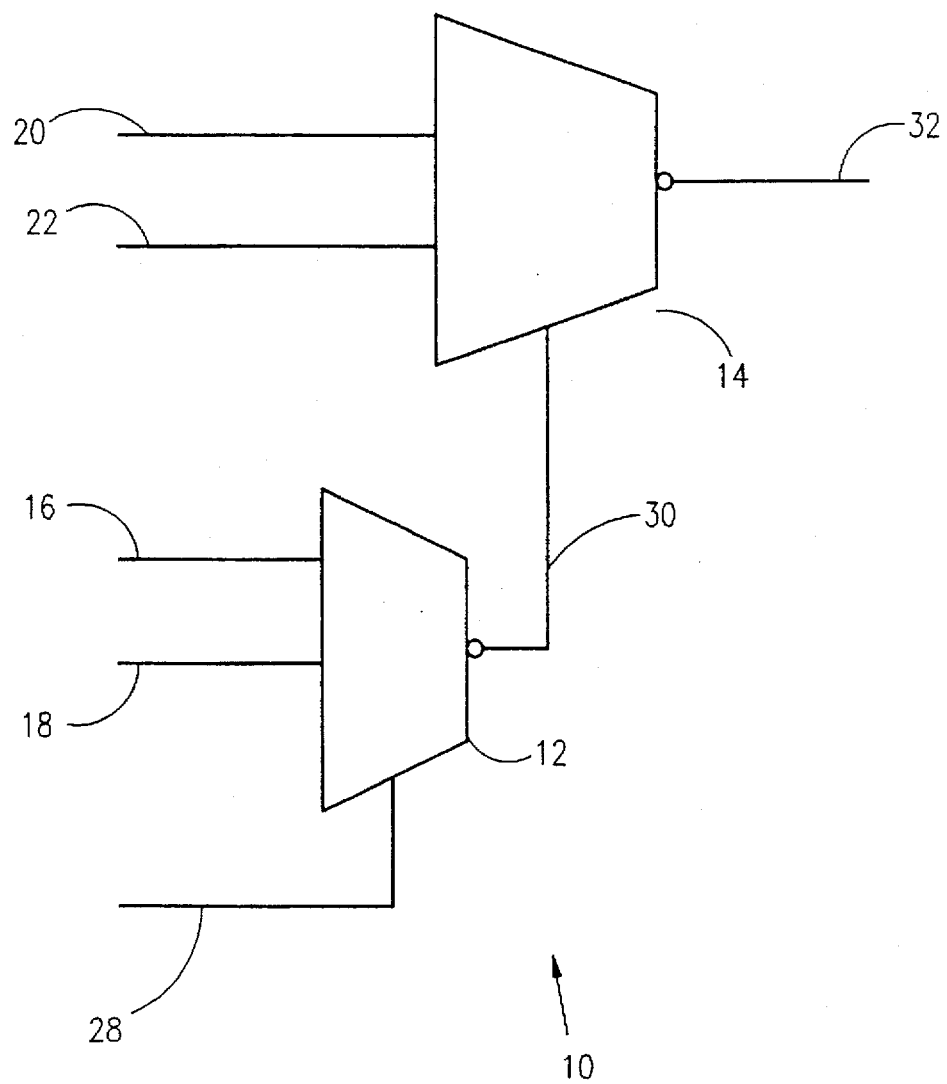
FIG. 6 is a simplified schematic illustration of a unit logic cell constructed and operative in accordance with a preferred embodiment of the present invention.

Reference is now made to FIG. 6, which is a schematic illustration of a unit logic cell 10 constructed and operative in accordance with a preferred embodiment of the present invention. The unit logic cell 10 comprises first and second multiplexers 12 and 14, wherein the output of the first multiplexer 12 is applied to the second multiplexer 14 as a select input.

First multiplexer 12 has first and second inputs 16 and 18, while second multiplexer 14 receives inputs 20 and 22. The first multiplexer 12 has a select input 28 and provides an inverted output 30 to the select input of multiplexer 14. Multiplexer 14 provides an inverted output 32.

Figure 7:
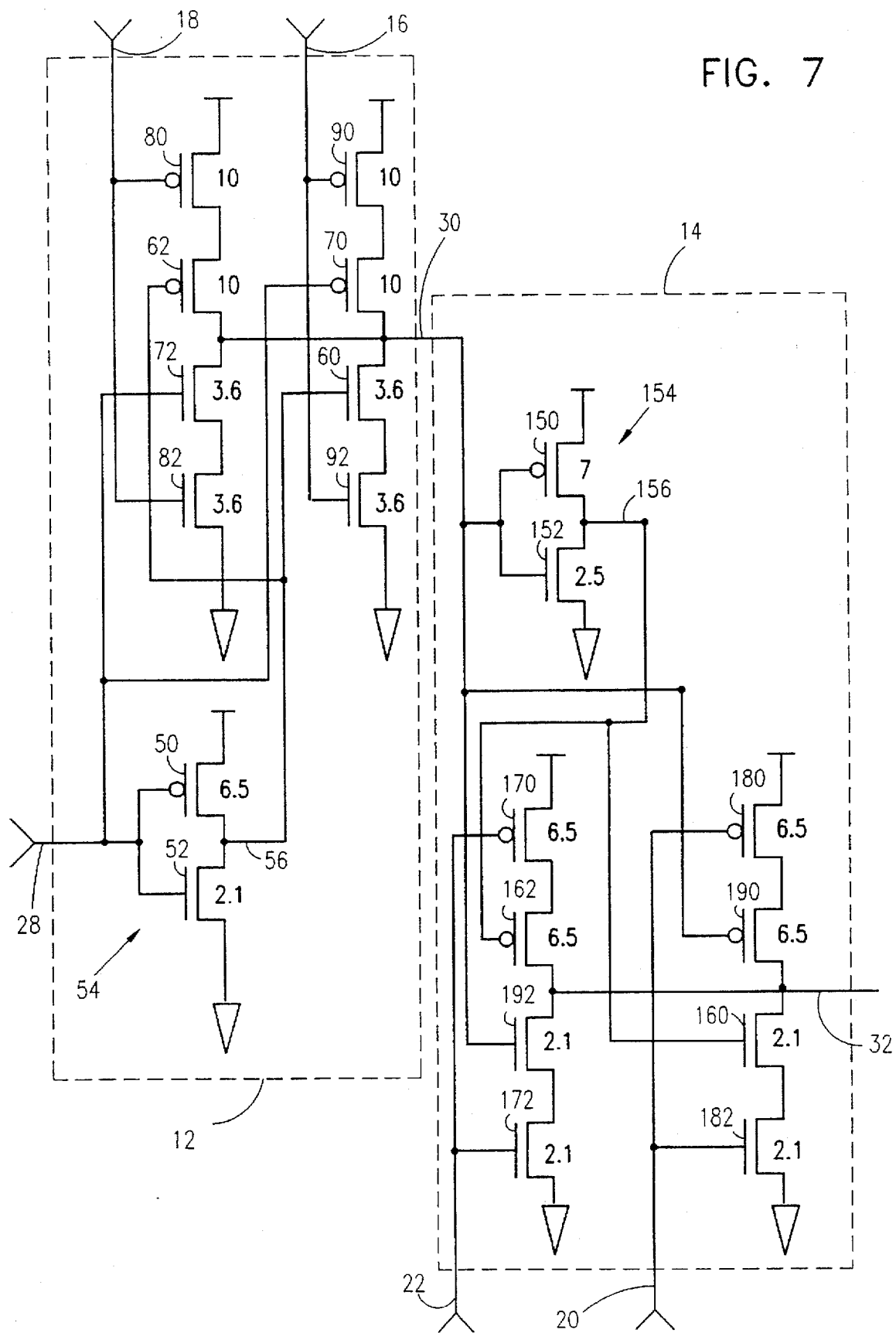
FIG. 7 is a simplified transistor level illustration of a unit logic cell constructed and operative in accordance with a preferred embodiment of the present invention and corresponding to FIG. 6.

Reference is now made to FIG. 7, which illustrates at transistor level a preferred embodiment of the unit logic cell 10 of FIG. 6. It is seen that multiplexer 12 comprises a total of ten transistors of four different sizes. Input 28 (FIG. 6) is connected to the gates of a P-transistor 50 and an N transistor 52, the P transistor 50 typically having a width of 6.5 microns and the N transistor 52 having a width of 2.1 microns. It is appreciated that transistors 50 and 52, interconnected as shown, constitute a CMOS inverter, indicated generally by reference numeral 54, whose output 56 is coupled to the gate of an N-transistor 60, typically having a width of 3.6 microns and to the gate of a P-transistor 62, typically having a width of 10 microns.

The dimensions of the transistors mentioned throughout refer specifically to a process file known as TS60T of Tower Semiconductor Ltd. of Migdal Haemek, Israel. All specified transistors are of 0.6 micron channel length. Other dimensions are appropriate for semiconductors manufactured using other process files, it being appreciated that the relative dimensions will remain generally the same.

Input 28 (FIG. 6) is also connected to the gates of a P-transistor 70 and an N transistor 72, the P transistor 70 typically having a width of 10 microns and the N transistor 72 having a width of 3.6 microns.

Input 18 (FIG. 6) is connected to the gates of a P-transistor 80 and an N transistor 82, the P transistor 80 typically having a width of 10 microns and the N transistor 82 having a width of 3.6 microns. Input 16 (FIG. 6) is similarly connected to the gates of a P-transistor 90 and an N transistor 92, the P transistor 90 typically having a width of 10 microns and the N transistor 92 having a width of 3.6 microns.

The above-described transistor arrangement provides a multiplexer whose output 30 is coupled to the drains of transistors 62 and 70 and to the sources of transistors 60 and 72.

Output 30 from multiplexer 12 is coupled to multiplexer 14 as a select input and is connected to the gates of a P-transistor 150 and an N transistor 152, the P transistor 150 typically having a width of 7 microns and the N transistor 152 having a width of 2.5 microns. It is appreciated that transistors 150 and 152, interconnected as shown, constitute a CMOS inverter, indicated generally by reference numeral 154, whose output 156 is coupled to the gate of an N-transistor 160, typically having a width of 2.1 microns and to the gate of a P-transistor 162, typically having a width of 6.5 microns.

Input 22 (FIG. 6) is also connected to the gates of a P-transistor 170 and an N transistor 172, the P transistor 170 typically having a width of 6.5 microns and the N transistor 172 having a width of 2.1 microns.

Input 20 (FIG. 6) is connected to the gates of a P-transistor 180 and an N transistor 182, the P transistor 180 typically having a width of 6.5 microns and the N transistor 182 having a width of 2.1 microns.

Output 30 (FIG. 6) is connected to the gates of a P-transistor 190 and an N transistor 192, the P transistor 190 typically having a width of 6.5 microns and the N transistor 192 having a width of 2.1 microns.

The above-described transistor arrangement provides a multiplexer 14 whose output 30 constitutes the output of the unit logic cell and is coupled to the drains of transistors 162 and 190 and to the sources of transistors 160 and 192.

Figure 1A:
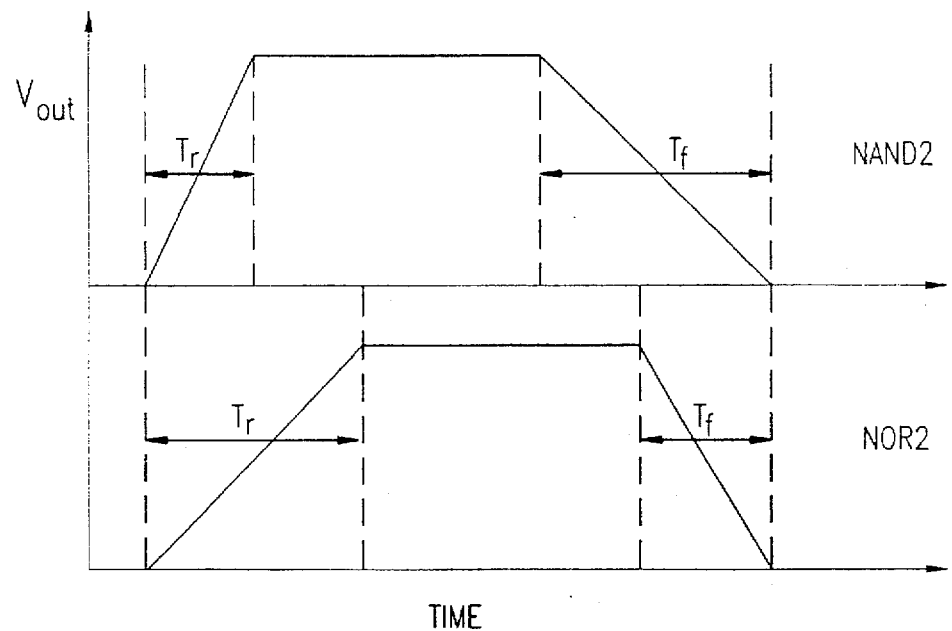
FIG. 1A illustrates the difference between rise time and fall time of the output signal voltage of a NAND2 function and a NOR2 function in a prior art gate array.
Figure 1B:
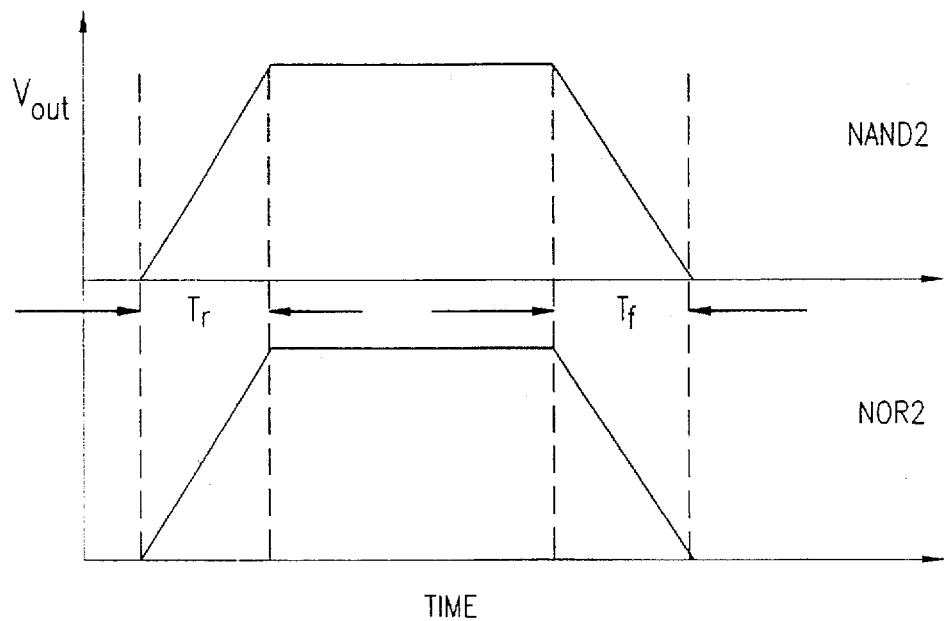
FIG. 1B illustrates the equality of rise time and fall time of the output signal voltage of a NAND2 function and a NOR2 function in a gate array constructed and operative in accordance with a preferred embodiment of the present invention.
Figure 2A:
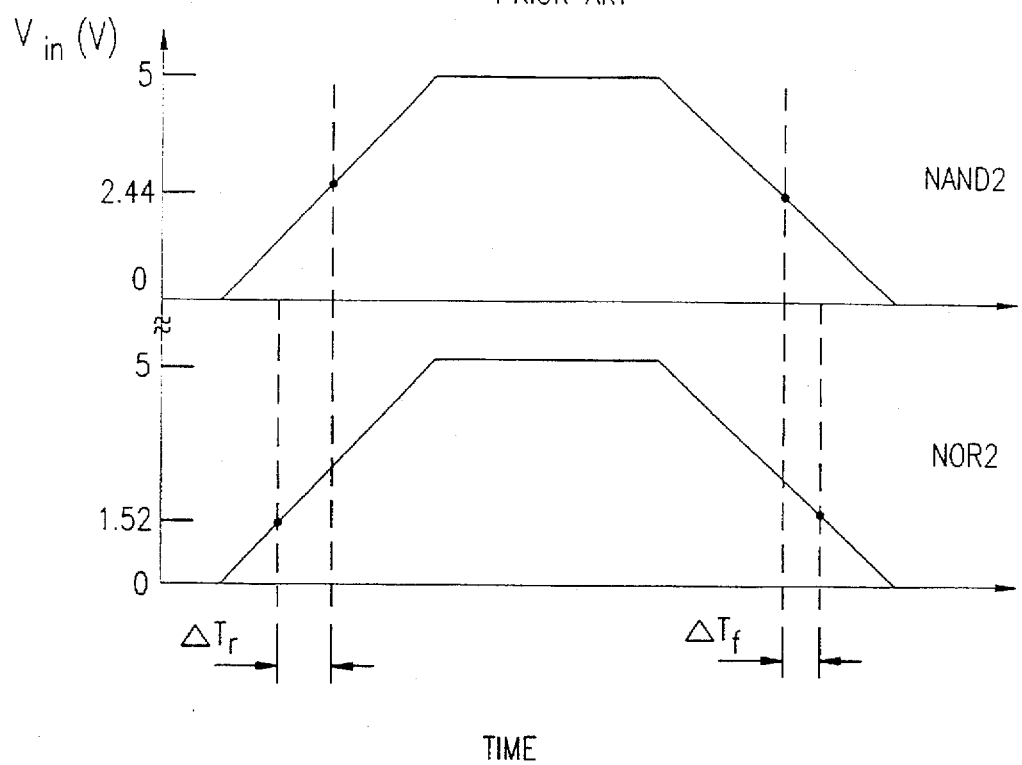
FIG. 2A illustrates the difference between the threshold switching voltage of two different functions in a prior art gate array.
Figure 2B:
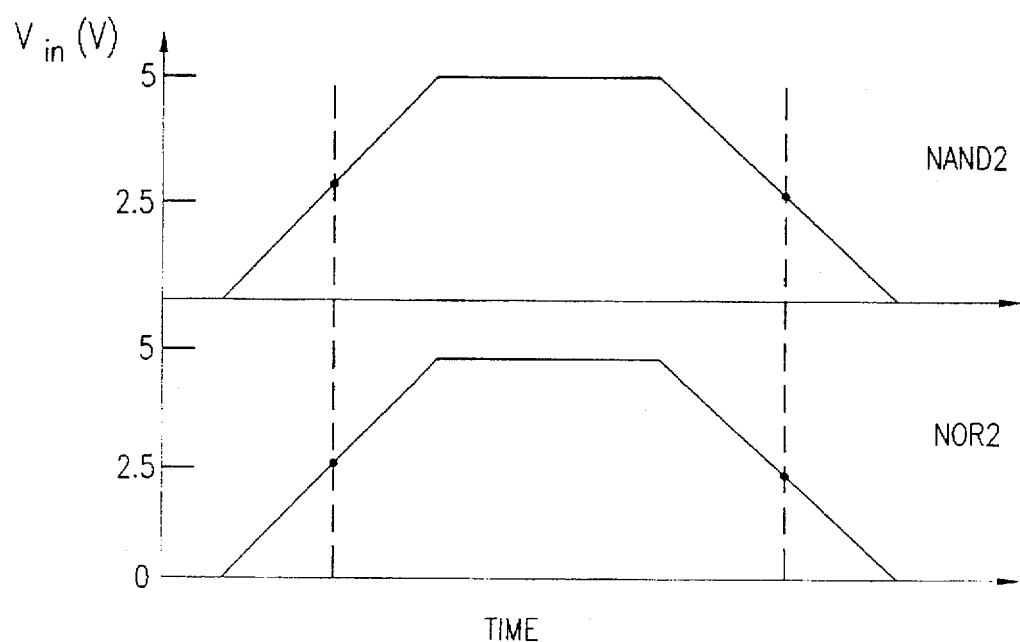
FIG. 2B illustrates the fixed level of the threshold switching voltage of two different functions in a gate array constructed and operative in accordance with a preferred embodiment of the present invention.
Figure 3A:
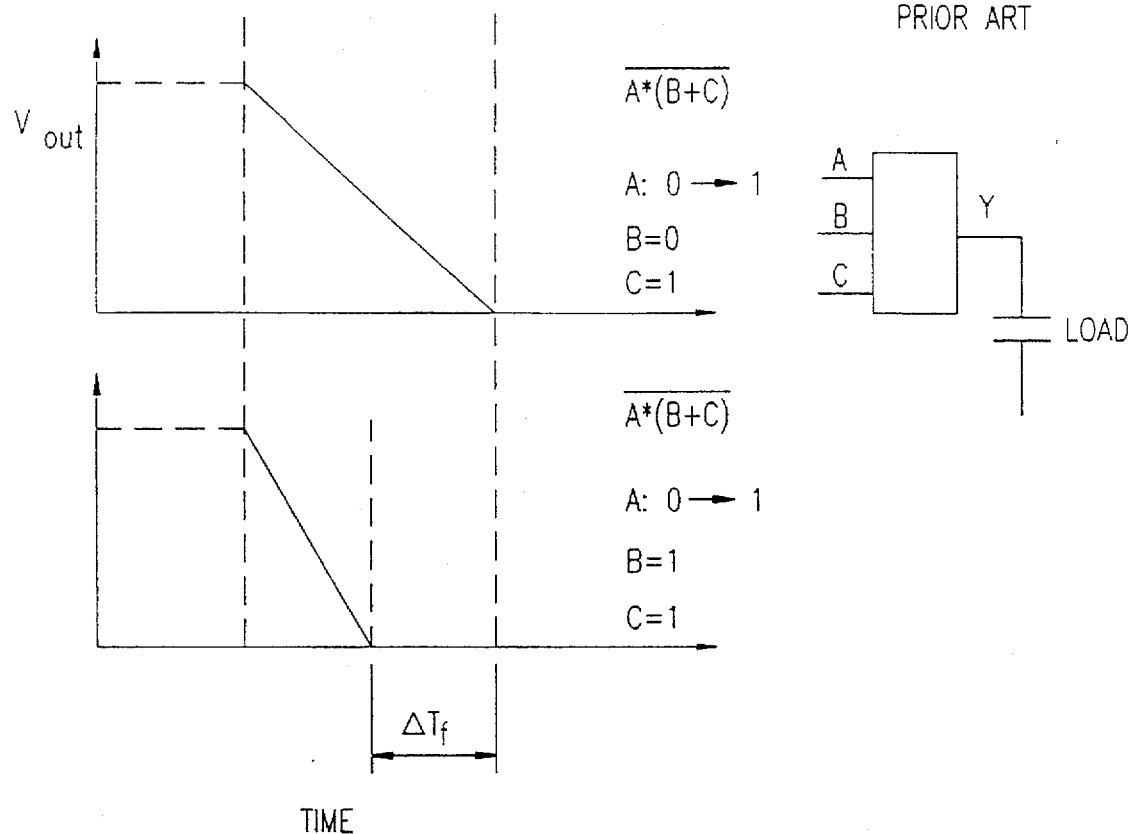
FIG. 3A illustrates the state dependency of the output drive capability in prior art gate arrays.
Figure 3B:
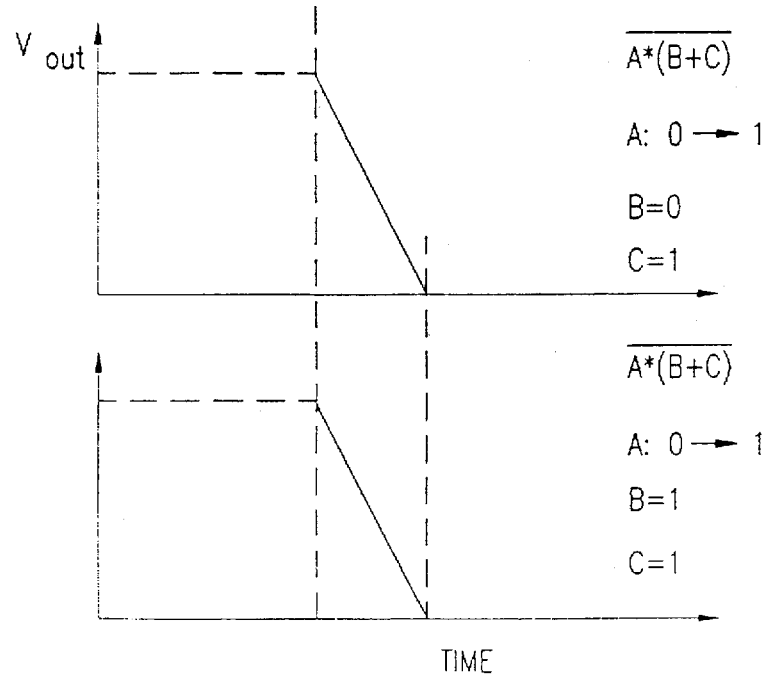
FIG. 3B illustrates the state independence of the output drive capability in gate arrays constructed and operative in accordance with a preferred embodiment of the present invention.
Figure 4A:
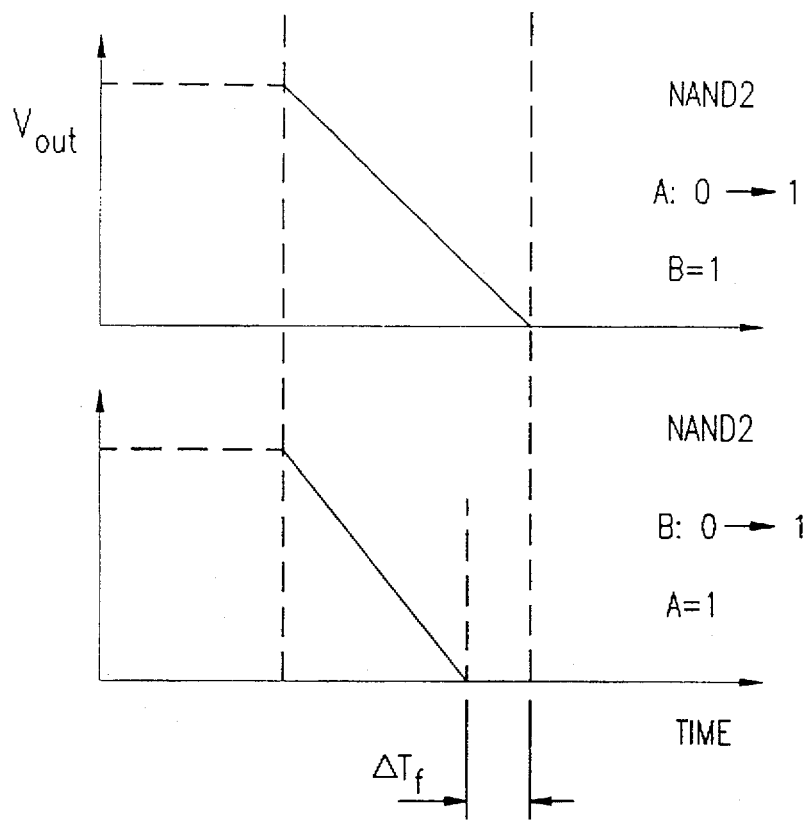
FIG. 4A illustrates the path dependency of the drive capability of a given function in prior art gate arrays.
Figure 4B:
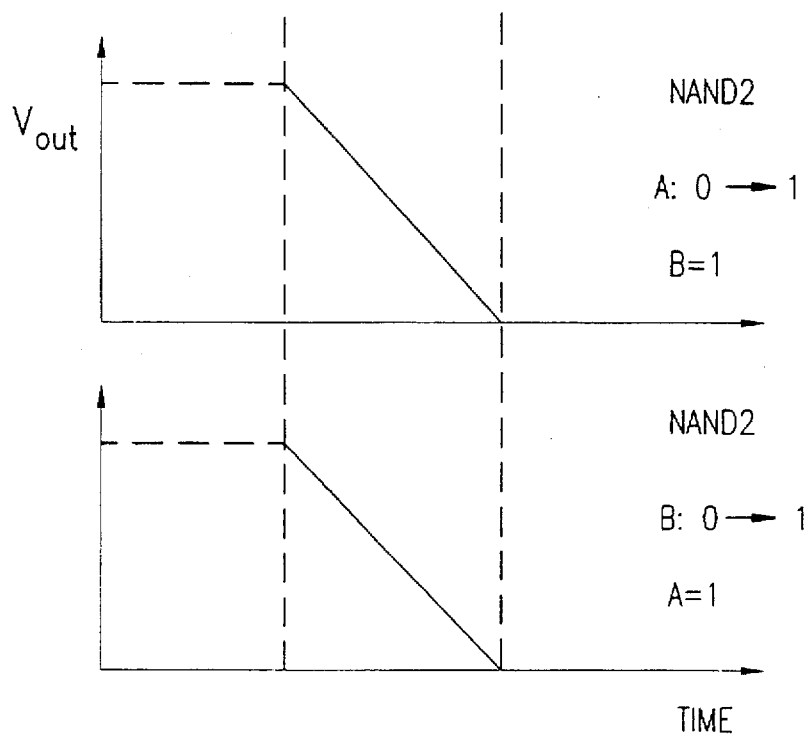
FIG. 4B illustrates the path independence of the drive capability of a given function in gate arrays constructed and operative in accordance with a preferred embodiment of the present invention.

It will be appreciated by persons skilled in the art that, as can be verified by the use of a simulation program, such as HSPICE (Ver. 95.2) commercially available from Meta—Software, Inc., the circuitry shown in FIG. 7, produces a unit logic cell having the following advantageous characteristics:

A. generally identical slopes of the rise and fall times of their output signals, as illustrated in FIG. 1B;

B. a switching voltage at 0.5 Vcc independent of the logic function implemented by the unit logic cell, as illustrated in FIG. 2B;

C. a state independent drive capability, as illustrated in FIG. 3B;

D. a path-independent drive capability, as illustrated in FIG. 4B; and

E. a state independent pin-to-pin delay, as illustrated in FIG. 5B.

The unit logic cell described hereinabove in connection with FIGS. 6 and 7 may be operative to provide a number of different logic functions, some of which are illustrated in FIGS. 8A–8E.

As seen in FIG. 8A, if input 20 is a logic 1 and input 22 is a logic 0, and input 16 is a logic 0 and inputs 18 and 28 receive the variables B and A respectively, the unit cell functions as a NAND gate.

As seen in FIG. 8B, if input 20 is a logic 1 and input 22 is a logic 0, and input 18 is a logic 1 and inputs 16 and 28 receive the variables B and A respectively, the unit cell functions as a NOR gate.

As seen in FIG. 8C, if input 20 is a logic 0 and input 22 is a logic 1, and input 16 is a logic 0 and inputs 18 and 28 receive the variables B and A respectively, the unit cell functions as an AND gate.

As seen in FIG. 8D, if input 20 is a logic 0 and input 22 is a logic 1, and input 18 is a logic 1 and inputs 16 and 28 receive the variables B and A respectively, the unit cell functions as an OR gate.

As seen in FIG. 8E, if input 20 is a logic 1 and input 22 is a logic 0, input 16 is a logic 0 and input 18 is a logic 1 and input 28 receive the variable A, the unit cell functions as an inverter.

It is appreciated that since the transistor arrangement of FIG. 7 provides the abovementioned characteristics A–E, and since the abovementioned functions are all implemented on the same unit logic cells of FIG. 7, all these functions have the same timing characteristics, the same delay characteristics, the same output characteristics, the same switching voltage characteristics, and the same drive characteristics.

Furthermore, it is appreciated that since the unit logic cell of FIG. 7 is designed to be state independent, it can be configured to produce the various logic functions by setting some of its inputs at logic 1 or logic 0 with the resultant function preserving the characteristics of the arrangement of FIG. 7. The various functions have identical output characteristics.

Unit logic cells constructed and operative in accordance with a preferred embodiment of the present invention are particularly useful in the construction of a logic library for a gate array which is based on these unit logic cells. Only a single unit cell of very simple and predictable properties is employed in the construction of typically over 200 different logic functions (5 examples of which are described hereinabove). Furthermore, because of the special characteristics of the unit cell, its characteristics are present in the entire library. Thus, for example, all library cells have the same switching voltage of Vcc/2.

While it is appreciated that the implementation of relatively simple logic functions may appear to be less than optimally efficient, the implementation of more complex logic functions is relatively straightforward and highly efficient.

It will be appreciated by persons skilled in the art that the present invention is not limited by what has been particularly shown and described hereinabove. Rather the scope of the present invention is defined only by the claims which follow:

We claim:

1. A very high speed customizable logic array device comprising:

a substrate having at least one gate layer and at least one metal layer, said gate layer including a multiplicity of identical unit logic cells, said customizable logic array device including at least three of the following functionalities:

NAND, NOR, inverter, AND and OR and further being characterized in that the ratio between the rise time and the fall time of the logic cells embodying each of said at least three functionalities is constant.

2. A customizable logic array device according to claim 1 and wherein the ratio between the rise time and the fall time is approximately equal to 1.

3. A customizable logic array device according to claim 2 and wherein the switching voltages of the at least three functionalities differ from each other by less than 10%.

4. A customizable logic array device according to claim 1 and wherein the switching voltages of the at least three functionalities differ from each other by less than 10%.

5. A customizable logic array device according to claim 1 and wherein said multiplicity of unit logic cells each comprise at least one multiplexer.

6. A very high speed customizable logic array device according to claim 1 and further being characterized in that said at least three functionalities all operate on a generally similar switching voltage.

7. A customizable logic array device according to claim 1 and wherein said functionalities are implemented by configuring said at least one metal layer.

8. A customizable logic array device according to claim 1 and wherein the rise time and fall time for at least one of said logic cells are each less than one nanosecond, when one of said logic cells drives a load of at least one other of said logic cells.

9. A very high speed customizable logic array device comprising:

a substrate having at least one gate layer and at least one metal layer, said gate layer including a multiplicity of identical unit logic cells, said customizable logic array device including at least three of the following functionalities:

NAND, NOR, inverter, AND and OR and further being characterized in that said at least three functionalities all operate on at least one of generally similar switching voltage and generally similar timing.

10. A customizable logic array device according to claim 9 and wherein said timing is state independent.

11. A customizable logic array device according to claim 9 and wherein the switching voltages of the at least three functionalities differ from each other by less than 10%.

12. A very high speed customizable logic array device comprising:

a substrate having at least one gate layer and at least one metal layer, said gate layer including a multiplicity of identical unit logic cells, said customizable logic array device including at least three of the following functionalities:

NAND, NOR, inverter, AND and OR and further being characterized in that said at least three functionalities, when driving identical circuitry, all have identical rise times and identical fall times.

13. A customizable logic array device according to claim 3 and wherein the switching voltages of the at least three functionalities differ from each other by less than 10%.

14. A very high speed customizable logic array device comprising:

a substrate having at least one gate layer and at least one metal layer, said gate layer including a multiplicity of identical unit logic cells, said customizable logic array device including at least three of the following functionalities:

NAND, NOR, inverter, AND and OR and further being characterized in that said at least three functionalities all operate on a generally similar switching voltage.

15. A customizable logic array device according to claim 14 and wherein the switching voltages of the at least three functionalities differ from each other by less than 10%.

* * * * *